United States Patent [19]

Wetzel et al.

[11] Patent Number: 4,669,871

[45] Date of Patent: Jun. 2, 1987

[54] PHOTOGRAPHIC PRINTING PLATE AND METHOD OF EXPOSING A COATED SHEET USING SAME

[75] Inventors: Charles M. Wetzel, Warwick Township, Lancaster County; John J. Moscony, Manheim Township, Lancaster County; Thomas J. Michielutti, Lancaster; Dean T. Deibler, Warwick Township, Lancaster County, all of Pa.

[73] Assignee: RCA Corporation, Princeton, N.J.

[21] Appl. No.: 892,072

[22] Filed: Aug. 1, 1986

[51] Int. Cl.⁴ ............................................. G03B 27/20
[52] U.S. Cl. ....................................... 355/91; 355/87; 430/5; 430/23; 430/327
[58] Field of Search ..................... 355/87, 91; 430/327, 430/5, 23

[56] References Cited

U.S. PATENT DOCUMENTS

| | | | |
|---|---|---|---|
| 3,199,430 | 8/1965 | Brown | 95/73 |
| 3,313,225 | 4/1967 | Mears | 95/75 |
| 3,615,468 | 10/1971 | Tiala | 96/36.3 |
| 3,751,250 | 8/1973 | Moscony et al. | 96/36 |
| 3,897,251 | 7/1975 | Detrick et al. | 96/38.3 |
| 4,061,529 | 12/1977 | Goldman et al. | 156/644 |
| 4,588,676 | 5/1986 | Moscony et al. | 430/327 |

Primary Examiner—Monroe H. Hayes
Attorney, Agent, or Firm—Eugene M. Whitacre; Dennis H. Irlbeck; Vincent J. Coughlin, Jr.

[57] ABSTRACT

A method and apparatus for exposing a layer of photoresist on a sheet includes positioning the sheet in a vacuum printing frame comprising a glass photographic printing plate carrying an opaque master pattern of metal or metal oxide on a central area of the printing plate. A light transmissive rubbery material is patterned in such a fashion as to overlie the opaque portions of the master pattern and provide a continuous path between the islands overlying the opaque master pattern. The rubbery material also extends in the peripheral area of the photographic printing plate and a plurality of mesas separated by channels are formed in this peripheral area. The channels have a width substantially greater than the path width formed between adjacent islands of rubbery material overlying the opaque portions of the pattern. The peripheral channels facilitate the evacuation of the plate and reduce evacuation time. The mesas of rubbery material in the peripheral area of the plate through which the channels are formed act as supports to space the printing plate from the resist coating on the metal sheet so that evacuation of the space between the printing plate and the sheet can be achieved without having the printing plate either be sealed-off by the metal sheet or by a second printing plate which is located on the opposite side of the metal sheet.

7 Claims, 8 Drawing Figures

PHOTOGRAPHIC PRINTING PLATE AND METHOD OF EXPOSING A COATED SHEET USING SAME

BACKGROUND OF THE INVENTION

This invention relates to a novel method for photoexposing a coated sheet in a vacuum printing frame prior to etching. The novel method may be used, for example, in preparing slit or apertured masks for use in color television tubes and display picture tubes. The invention includes a novel printing plate which is especially useful in the novel method.

The preparation of apertured masks by photoexposure and etching has been described previously; for example, in U.S. Pat. Nos. 3,199,430 to S. A. Brown, 3,313,225 to N. B. Mears, 3,751,250 to J. J. Moscony et al. and 4,061,529 to A. Goldman et al. In a typical process, a thin sheet of metal, such as cold-rolled steel or a nickel-iron alloy, is coated on both major surfaces with a light-sensitive resist or enamel. Then, the coated sheet is positioned between two glass photographic printing plates, each plate carrying an opaque photographic master pattern on its inward-facing surface, each master pattern being accurately positioned with respect to the other. Each plate is usually comprised of a central area bearing the photographic master pattern and a peripheral area which is clear. The glass plates are mounted in spaced relation from one another in an equipment referred to as a vacuum printing frame. When the coated sheet is in the desired position, the printing frame is evacuated whereby the master patterns on the glass plates are pressed firmly against the coatings on the sheet. Then, the coatings are exposed to actinic radiation which passes through the glass plates for a time interval until the coatings are suitably exposed. The frame is then devacuated; that is, brought back to atmospheric pressure. The glass plates are separated and the metal sheet with the exposed coatings thereon is removed from the frame. The exposed coatings may now be developed by removing the more-soluble portions thereof. Then, the sheet may be selectively etched, and finally the less-soluble portions of the coatings are removed from the sheet.

One of the problems encountered previously is the peripheral areas of the glass plates flex sufficiently to contact each other and increase the evacuation and devacuation times. In some prior structures the transparent portion of the emulsion supporting the master patterns extended into the peripheral areas of the glass plates. Grooves were sometimes randomly cut in the emulsions on the peripheral areas of the plates to speed the evacuation and devacuation process; however neither the locations nor the dimensions of the grooves were sufficiently controlled to substantially improve the evacuation and devacuation times. U.S. Pat. No. 3,751,250, referenced above, attempted to shorten the evacuation and devacuation times by removing at least a portion of the surface of the peripheral areas of the glass plates to a depth of between 0.076 mm (0.003 inch) and 0.254 mm (0.010 inch). Even on glass plates where the entire peripheral areas were removed to the above-described depth, seal-off due to plate flexing sometimes occurred. Additionally, the removal of glass in the peripheral areas of the plates introduced stress into the glass which subsequently lead to cracking of the glass plates.

U.S. Pat. No. 4,588,676 issued on May 13, 1986 to J. J. Moscony et al. describes a method for exposing a coating of photoresist on a metal sheet using glass plates having a very thin, uniform thickness opaque master pattern formed on the major surfaces of the glass plates which contact the coated sheet. The use of thin master patterns of the type described in U.S. Pat. No. 4,588,676 increases the evacuation and devacuation problem because even less flexing of the glass plates is required to seal-off the plates. To shorten the times for evacuating and devacuating the printing frame, transparent islands of rubbery material are provided on the patterned surfaces of the printing plates. The islands are allowed to overlap slightly into the peripheral area of the plate immediately adjacent to the master pattern. The islands are typically about 2 micrometers thick and spaced about 0.3 mm to 0.8 mm apart center-to-center. Experience has shown that the resulting gap is insufficient to consistently provide rapid evacuation and devacuation times. It is impractical to increase the height of the islands sufficiently or to otherwise increase the spacing between the plates and the coated sheet since such expedients, while decreasing the evacuation and devacuation times, will also increase the longitudinal spacing between the opaque elements of the master pattern and the coated metal sheet, thereby reducing the resolution or sharpness of the projected master pattern onto the coated sheet.

SUMMARY OF THE INVENTION

The novel method employs at least one printing plate, and preferably two plates, including a central area and a peripheral area. A master pattern having opaque and non-opaque portions is formed substantially within the central area of the plate on one major surface thereof. The novel method includes the steps employed in prior methods of providing a sheet with a light sensitive resist, positioning the printing plate and the coated sheet in a vacuum printing frame, evacuating the frame, exposing the coating to actinic radiation through the master pattern, and then devacuating the frame.

The time required for evacuating and devacuating the vacuum frame can be reduced by coating the master pattern with islands of a rubbery material that are transmissive to the exposing radiation and by coating the peripheral area of the plate with the same rubbery material and forming a plurality of channels therein. The channels are substantially wider than and communicate with the continuous path formed between the islands. The rubbery material adjacent to the channels in the peripheral area of the plate supports the plate and maintains a sufficient spacing between the plate and the resist coated sheet to facilitate evacuation and devacuation of the air between the plate and the resist coated sheet.

DETAILED DESCRIPTION OF THE PREFERRED EMBODIMENT

The novel method and apparatus described below is part of a wet chemical etching process and structure for fabricating apertured structures such as shadow masks for use in color cathode-ray tubes, including television picture tubes and display tubes.

Figure 1:
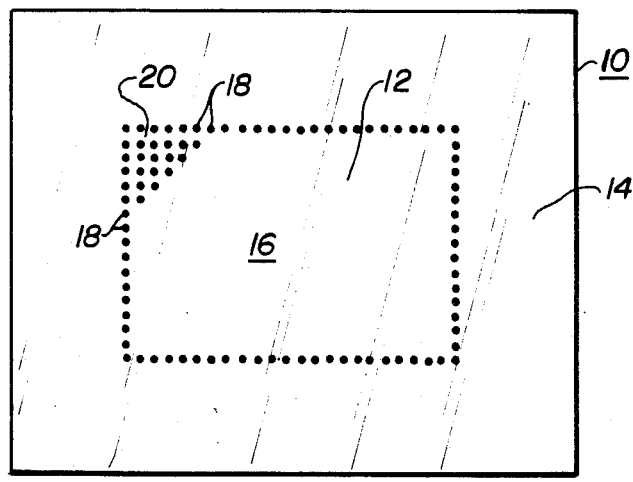
FIG. 1 is a plan view of a glass plate including a master pattern used in the method of the present invention.
Figure 2:
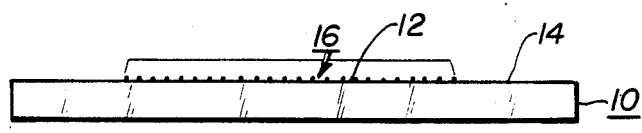
FIG. 2 is a side view of the plate shown in FIG. 1.

FIG. 1 shows a plan view of an optically transparent glass support plate 10 having a central area 12 and a peripheral area 14 with a master pattern 16 formed on the central area 12 of one major surface of the support plate. The master pattern 16 includes a plurality of opaque portions 18 (only some of which are shown) and a non-opaque or light transmissive portion 20 separating the opaque portions 18. The opaque portions 18 of the master pattern 16 have a substantially uniform thickness in the range of 0.5±0.2 micrometers and are formed of vapor-deposited or chemically-deposited iron oxide, vapor-deposited chromium or electrolessly-deposited nickel as described U.S. Pat. No. 4,588,676 issued to J. J. Moscony et al. on May 13, 1986 and incorporated by reference herein for the purpose of disclosure. The opaque portions 18 of the master pattern 16 may comprise either an array of circular dot or linear elements as is known in the art. Preferably, the circular dots form a hexagonal pattern, although any configuration may be used. As shown in the side view of FIG. 2, the master pattern 16 occupies the central area 12 of the support plate 10 and the peripheral area 14 is clear, i.e., no portion of the master pattern extends into the peripheral area of the support plate.

Figure 3:
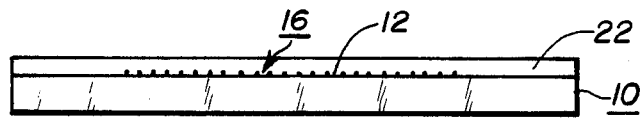
FIG. 3 is a side view of the plate shown in FIG. 1 including a light-hardenable rubbery coating on one surface of the plate.

As shown in FIG. 3, a coating 22 of a light transmitting rubbery material is provided on the one major surface of the support plate 10 supporting the master pattern 16. The coating 22 covers both the central area 12 and the peripheral area 14 of the support plate 10. A preferred material for forming the coating 22 is light-hardened (insolubilized) KPR marketed by Eastman Kodak Company, Rochester, N.Y. The coating 22 is generally about one to three micrometers thick which is much thicker than the master pattern 16. A thickness of about 2 micrometers is preferred.

Figure 4:
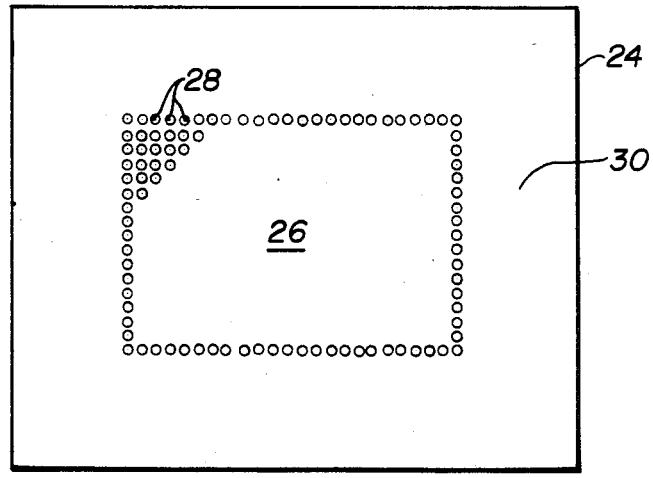
FIG. 4 is a plan view of a check-out plate used in the method of the invention.
Figure 5:
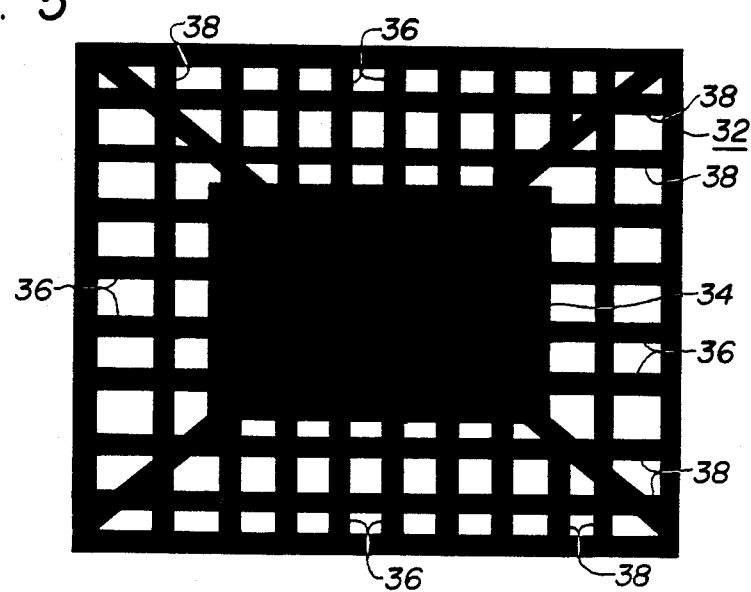
FIG. 5 is a plan view of a channel-master plate used in the method of the invention.

A photographic printing plate 10' is formed from the support plate 10 by the sequence of steps illustrated in FIGS. 4 and 5. A checkout plate 24 having a central portion 26 comprising a plurality of oversize apertures 28, which correspond in location to the opaque portions 18 of the glass support plate 10, is located against and in register with the glass support plate 10 so that the checkout plate 24 rests on the coating 22 on the support plate. A peripheral portion 30 of the checkout plate 24 is non-transmissive to light. Preferably, the checkout plate 24 comprises a glass emulsion plate or the equivalent having the apertures 28 formed thereon. The checkout plate 24 and the glass support plate 10, having the coating 22 disposed on one surface thereof, are positioned in a frame, which is then evacuated, and actinic radiation is allowed to pass through the apertures 28 of the checkout plate 24 to insolubilize the exposed portions of the coating 22 on the support plate 10. The checkout plate 24 is then removed from in contact with the coating 22 on the support plate 10 and a channel master plate 32 is registered with the support plate 10 so that the center portion 34 of the channel master plate covers the master pattern 16 on the support plate 10. The central portion 34 of the channel master plate 32 is non-transmissive to actinic radiation. A plurality of non-transmissive spokes 36 radiate outwardly from the central portion 34 of the channel master plate 32 to the periphery thereof. Additionally, a plurality of non-transmissive bars 38 which are formed substantially parallel to the edges of the master pattern 16 intersect the spokes 36. With the channel master plate 32 in register with the glass support plate 10, actinic radiation passes through the light transmissive portions of the channel master plate 32 to irradiate selected portions of the coating 22 on the periphery 14 of the glass support plate 10. The coating 22 is then developed such that the portions of the coating 22 which were exposed to actinic radiation are light-hardened and rendered insoluble relative to the portions of the coating 22 which were shadowed by the non-transmissive portions of the checkout plate 24 and the channel master plate 32.

Figure 6:
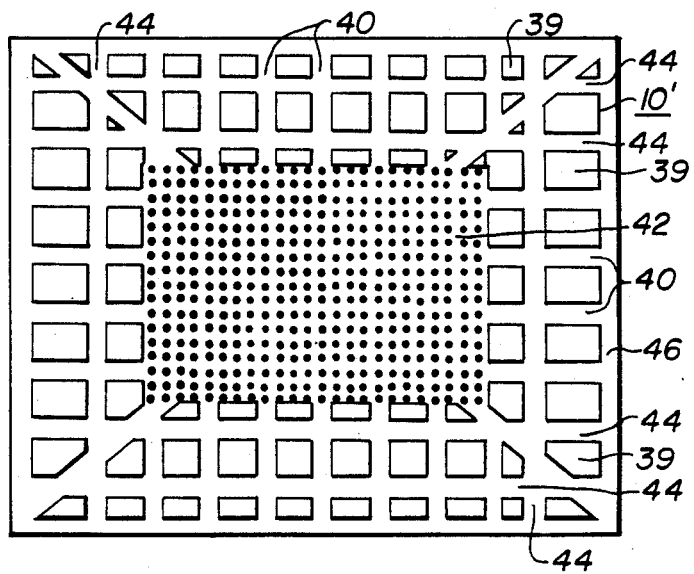
FIG. 6 is a plan view of a working plate according to the method of the invention having a master pattern and channels in a peripheral area of the plate.
Figure 8:
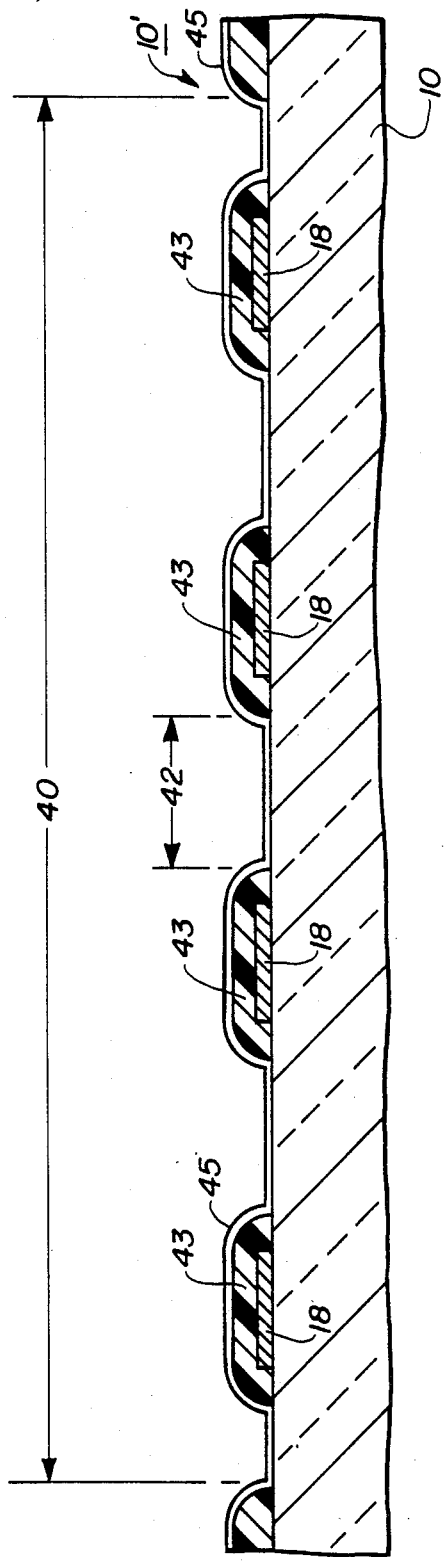
FIG. 8 is a partial sectional view of a working plate showing one of the channels in the peripheral area and a portion of the master pattern including islands of rubbery material and the path therebetween.

FIG. 6 shows a photographic printing plate 10' subsequent to the development of the coating 22. The peripheral area 14 of the support plate 10 (shown in FIGS. 1 and 2) is now covered by a plurality of irregularly-shaped mesas 39 separated by precisely formed first channels 40 which radiate outwardly from the master pattern 16 to the outside edge of the support plate 10. The mesas 39 having substantially flat tops and an overall height of about 2 micrometers. The first channels 40 communicate with a continuous path 42 formed between the islands 43 (see FIG. 8) of rubbery material which cover and extend beyond the opaque portions 18 of the master pattern 16. The islands 43 also have a height of about 2 micrometers. A thin, less than 0.1 micrometer thickness, coating of soft paste wax 45 may be provided over the rubbery material of the mesas 39 and islands 43 to reduce abrasion and friction as described in U.S. Pat. No. 4,588,676 referenced herein. The first channels 40 are formed by the shadowing of the coating 22 by the spokes 36. As shown in FIGS. 6 and 8, the channels 40 have a width substantially greater than the width of the continuous path 42 extending between the islands 43 of rubbery material covering the opaque portions 18 of the master pattern 16. A plurality of precisely formed second channels 44, formed by the shadowing of the coating 22 by the bars 38, intersect selected ones of the first channels 40. A border channel 46, may also be formed by the shadowing of the bars 38, extends around the perimeter of the printing plate 10'. The first, second and border channels 40, 44 and 46, respectively are typically about 6.4 to 19 mm wide, although 16 mm is preferred.

Figure 7:
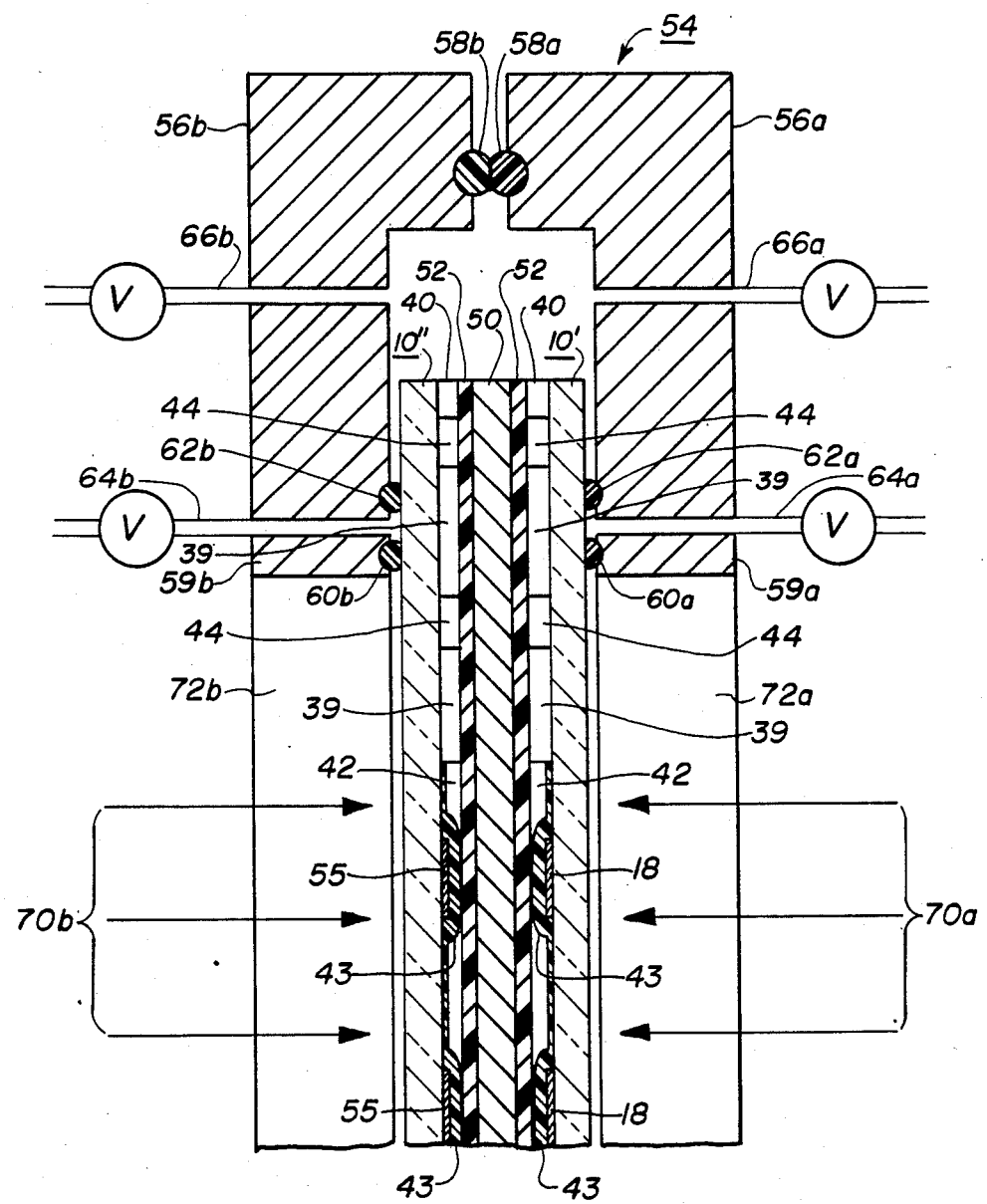
FIG. 7 is a sectional view of a vacuum printing frame showing partially broken away coatings on a pair of working plates in contact with coated surfaces of a metal sheet during the step of exposing the coatings through the master pattern.

With reference to FIG. 7, a shadow mask for a color cathode-ray tube is formed by coating opposed major surfaces of a sheet 50 of metal, e.g., cold-rolled steel or a nickel-iron alloy such as Invar, with a negative photoresist 52. Suitable negative photoresists include dichromate-sensitized casein, dichromate-sensitized polyvinyl alcohol or dichromate-sensitized fish glue. The metal sheet 50 carrying the coatings of photoresist 52 is positioned in a vacuum printing frame 54 between a pair of first and second photographic printing plates one of which is the plate 10'. The second photographic print plate 10" is made by the process described for plate 10' and differs only in that the opaque portions 55 of a second master pattern may differ in size from the opaque portions 18 on the printing plate 10'. The first and second channels 40 and 44 formed on each of the plates 10' and 10" are the mirror images of each other. The reason for the difference in the sizes of the opaque portions 18 and 55 is so that an electron beam (not shown) passing through an aperture in the subsequently formed shadow mask will not be intercepted by the sidewalls of the aperture. The structure of such a shadow mask is well known in the art and need not be described herein.

The method for photoexposing a coated sheet of metal such as sheet 50 having photoresist coatings 52 on opposed major surfaces thereof will be described with reference to FIG. 7. The photographic printing plates 10' and 10" are positioned in the vacuum printing frame 54 which comprises a pair of matched frame portions 56a and 56b. The frame portions include opposed rubber gaskets 58a and 58b around the frame portions 56a and 56b respectively which gaskets are capable of maintaining a vacuum seal when placed against one another. Each frame portion 56a (or 56b) has a ledge portion 59a and 59b respectively, which bears against the opposed major surfaces of the printing plates 10' and 10". A pair of concentric rubber gaskets 60a and 62a on the one ledge 59a and 60b and 62b on the other ledge 59b separate the plate 10' from ledge 59a and the plate 10" from the ledge 59b, respectively, thereby providing vacuum seals and resilient surfaces for the plates 10' and 10" to bear against. The frame portion 56a is also provided with first means 64a including piping and valves for evacuating the volume enclosed by the frame portion 56a, the glass plate 10' and the gaskets 60a and 62a. The frame portion 56b is also provided with second means 64b including piping and valves for evacuating the volume enclosed by the frame portion 56b, the glass plate 10" and the gaskets 60b and 62b. The frame portions 56a and 56b are also provided with third means 66a and fourth means 66b for evacuating the volume enclosed by the frame portions 56a and 56b. These means are also used to devacuate (bring to atmospheric pressure) the frame 54.

In the preferred embodiment of the invention, the two glass plates 10' and 10" are placed in their respective frame portions 56a and 56b with the master patterns facing one another. The sheet 50 having the coatings 52 thereon is positioned between the two photographic printing plates 10' and 10". The printing plates 10' and 10" are oriented such that the plurality of first, second and border channels 40, 44 and 46 in the peripheral area of the plates are substantially aligned with one another. In this configuration, the master patterns on the printing plates 10' and 10" are also aligned so that the center lines of the corresponding opaque portions 18 and 55 on each of the two printing plates 10' and 10" coincide. The printing plates 10' and 10" are held in place by vacuums applied to the first and second evacuating means 64a and 64b. The vacuum printing frame 54 is evacuated by drawing air out through the evacuating means 66a and 66b. Atmospheric pressure outside the frame 54 and the vacuum inside the frame draw the islands 43 covering the master patterns and the mesas 39 on the peripheral areas of the glass plates 10' and 10" against the photoresist coatings 52 as shown in FIG. 7. The mutually aligned first, second and border channels 40, 44 and 46 formed in the periphery of the printing plates 10' and 10" facilitate the evacuation of the plates by ensuring that the evacuation time on each side of the metal sheet 50 is substantially the same thereby preventing distortion of the metal sheet. The mesas 39 separating the channels 40 and 44 provide support to prevent the plates 10' and 10" from contacting either the metal sheet 50 or each other and restricting the evacuation paths thereby increasing the evacuation time. As shown in FIG. 8, the first channels 40 in the peripheral area of the photographic plate 10' are preferably about 16 mm wide and the width of the continuous path 42 between the islands 43 is about 0.05 mm to 0.64 mm wide. Since the first channels 40 in the peripheral area communicate with the continuous path 42 between the islands 43 of rubbery material covering the opaque portions 18 and 55 of the master patterns the evacuation of the printing frame 54 is improved over the prior art. Additionally, the border channels 46 prevent edge seal-off and reduce breakage of the plates 10' and 10"

With the vacuum applied, actinic radiation, represented by arrows 70a and 70b, from high intensity light sources (not shown) passes through the open areas 72a and 72b of the frame portions 56a and 56b respectively, through the glass printing plate 10' and 10" and is incident on the resist coatings 52 thereby exposing the coatings to hardening radiation. The portions of the coatings 52 shadowed by the opaque portions 18 and 55 of the master patterns are more soluble than the exposed portions of the coatings. The coatings 52 are subsequently developed to remove the more soluble, shadowed portions and to expose the surface of the metal sheet 50 as is known in the art. When the exposure is completed, the light is shuttered, the vacuum frame is devacuated and the metal sheet 50 is removed from between the photographic printing plates 10' and 10".

The novel method may be used for photoexposing either one or both sides of the major surfaces of a coated sheet of metal. The coated sheet may be fabricated into any of the products normally made by photoexposure.

What is claimed is:

1. A method for photoexposing a coated sheet, the steps comprising
    a. coating said sheet on at least one major surface thereof with a light sensitive resist
    b. positioning said sheet in a vacuum printing frame, said frame including an optically transparent support plate with two opposed major surfaces, said support plate having a central area and a peripheral area with a master pattern having opaque and nonopaque portions on one of said major surfaces substantially within said central area of said support plate, said one major surface having a coating of light transmitting rubbery material thereon, said opaque portions of said master pattern being covered by islands of said rubbery material leaving a continuous path therebetween, said peripheral area of said support plate having a plurality of precisely formed channels in said rubbery material, said channels being substantially wider than, and in communication with, said continuous path between said islands of rubbery material on said opaque portions of said master pattern, said coated surface of said sheet being positioned opposite said one major surface of said support plate, c. evacuating said frame to draw said rubbery material on said one major surface of said support plate into intimate contact with said coated surface of said sheet by exhausting the air therebetween through said continuous path and said channels, d. exposing said coating on said sheet to actinic radiation projected through said non-opaque portions of said master pattern, and e. then, devacuating said frame and removing said rubbery material from contact with said coated surface of said sheet.

2. A method for making an apertured mask for a cathode-ray tube, the steps comprising a. coating a metal sheet on both major surfaces thereof with a light sensitive resist, b. positioning said coated sheet between two optically transparent support plates in a vacuum printing frame, each of said support plates having a central area and a peripheral area with a master pattern having opaque and non-opaque portions formed within said central area on one major surface of each of said support plates, said one major surface of each of said support plates having a coating of light transmitting rubbery material thereon, said opaque portions of said master patterns on each of said support plates being covered by islands of said rubbery material having a continuous path therebetween, said peripheral area of each of said support plates having a plurality of mesas separated by a plurality of mutually aligned precisely formed channels in said rubbery material, said channels being substantially wider than and in communication with said continuous path between said islands of rubbery material on said opaque portions of said master patterns, c. evacuating said printing frame to draw said rubbery material into intimate contact with the coatings on the major surfaces of said metal sheet, d. exposing the coatings by projecting light through said master patterns, and e. then, devacuating said frame and removing said metal sheet from between said support plates.

3. In a photographic printing plate for use in a vacuum printing frame comprising an optically transparent support plate with two opposed major surfaces, said support plate having a central area and a peripheral area, a master pattern having opaque and non-opaque portions on one of said major surfaces substantially within said central area of said support plate, a coating of light transmitting rubbery material on said one major surface of said support plate, said opaque portions of said master pattern being covered by islands of said rubbery material leaving a continuous path therebetween, wherein the improvement comprises a plurality of mesas separated by precisely formed first channels in said coating of light transmitting rubbery material on said peripheral area of said support plate, each of said first channels communicating with said continuous path between said islands of rubbery material on said opaque portions of said master pattern, said first channels having a width substantially greater then the width of said continuous path.

4. The photographic printing plate defined in claim 3 wherein said first channels radiate outwardly from said master pattern to the outside edge of said support plate.

5. The photographic printing plate defined in claim 4 wherein a plurality of precisely formed second channels substantially parallel to the edges of said master pattern intersect selected ones of said first channels.

6. The photographic printing plate defined in claim 5 wherein a border channel extends around the perimeter thereof.

7. The photographic printing plate defined in claim 6, wherein said first, second and border channels have substantially the same width.

* * * * *